United States Patent
Bakker

(10) Patent No.: US 8,067,973 B2
(45) Date of Patent: Nov. 29, 2011

(54) DRIVER FOR A FLYBACK CONVERTER USING A TRANSCONDUCTANCE AMPLIFIER AND A COMPARATOR

(75) Inventor: Anthonius Bakker, Morgan Hill, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 12/697,947

(22) Filed: Feb. 1, 2010

(65) Prior Publication Data
US 2011/0187416 A1    Aug. 4, 2011

(51) Int. Cl.
*G06G 7/19* (2006.01)
(52) U.S. Cl. .................. 327/343; 327/428; 327/523
(58) Field of Classification Search .......... 327/343, 327/428, 453
See application file for complete search history.

(56) References Cited

U.S. PATENT DOCUMENTS

| | | | | |
|---|---|---|---|---|
| 5,396,412 A | * | 3/1995 | Barlage | 363/89 |
| 5,929,615 A | * | 7/1999 | D'Angelo et al. | 323/224 |
| 5,946,207 A | * | 8/1999 | Schoofs | 363/127 |
| 6,366,478 B1 | * | 4/2002 | Brakus | 363/21.06 |
| 6,452,367 B2 | * | 9/2002 | Watanabe | 323/267 |
| 6,788,553 B1 | * | 9/2004 | Jin et al. | 363/21.06 |
| 6,870,747 B2 | * | 3/2005 | Bridge | 363/21.06 |
| 6,995,991 B1 | * | 2/2006 | Yang et al. | 363/21.14 |
| 7,050,310 B2 | * | 5/2006 | Yang | 363/21.06 |
| 7,113,413 B1 | * | 9/2006 | Khasiev | 363/21.14 |

* cited by examiner

*Primary Examiner* — Kenneth B. Wells
(74) *Attorney, Agent, or Firm* — Perkins Coie LLP

(57) ABSTRACT

The present invention discloses a smart driver used in flyback converters adopting a transconductance amplifier to turn on a synchronous rectifier FET, and a comparator to quickly turn off the synchronous rectifier FET.

22 Claims, 2 Drawing Sheets

DRIVER FOR A FLYBACK CONVERTER USING A TRANSCONDUCTANCE AMPLIFIER AND A COMPARATOR

FIELD OF THE INVENTION

The present invention relates to flyback converters, and more particularly to flyback converters using synchronous rectification.

BACKGROUND ART

The majority of notebook power adapters use a flyback converter as shown in FIG. 1. To improve efficiency over diode rectification, most notebook power adapter manufacturers use synchronous rectification (SR). In other words, a synchronous rectifier FET is used to replace diode D on the secondary winding $T_1$ of the transformer T in the flyback converter shown in FIG. 1. A major disadvantage of SR over diode rectification is the higher cost, which is associated with the control signal that needs to be sent across the isolation barrier (the transformer).

Instead of sending the control signal across the isolation barrier, in certain prior art systems, the signal can also be derived from the voltage across the synchronous rectifier FET. One of the issues in doing this is that the voltage signal across the FET is very small compared to the dynamic range (millivolts versus tens of volts). To avoid false triggering, bandwidth is sacrificed. This leads to increased turn-off times, leading to efficiency losses.

Some prior art systems use a transconductance amplifier to slow the turn on of the synchronous rectifier FET, which solves the false triggering problem. However, slow turn-on makes it not useful in continuous conduction mode (CCM) applications. Furthermore, the transconductance amplifier brings a slow turn-off, which causes even more switching losses.

Therefore, there is an unmet need to provide a solution having a much faster turn-off and hence reduced switching losses. Moreover, the solution should be used in any type of flyback converter (CCM, discontinuous conductance mode (DCM), and quasi-resonant).

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail so as not to unnecessarily obscure aspects of the present invention.

Figure 1:
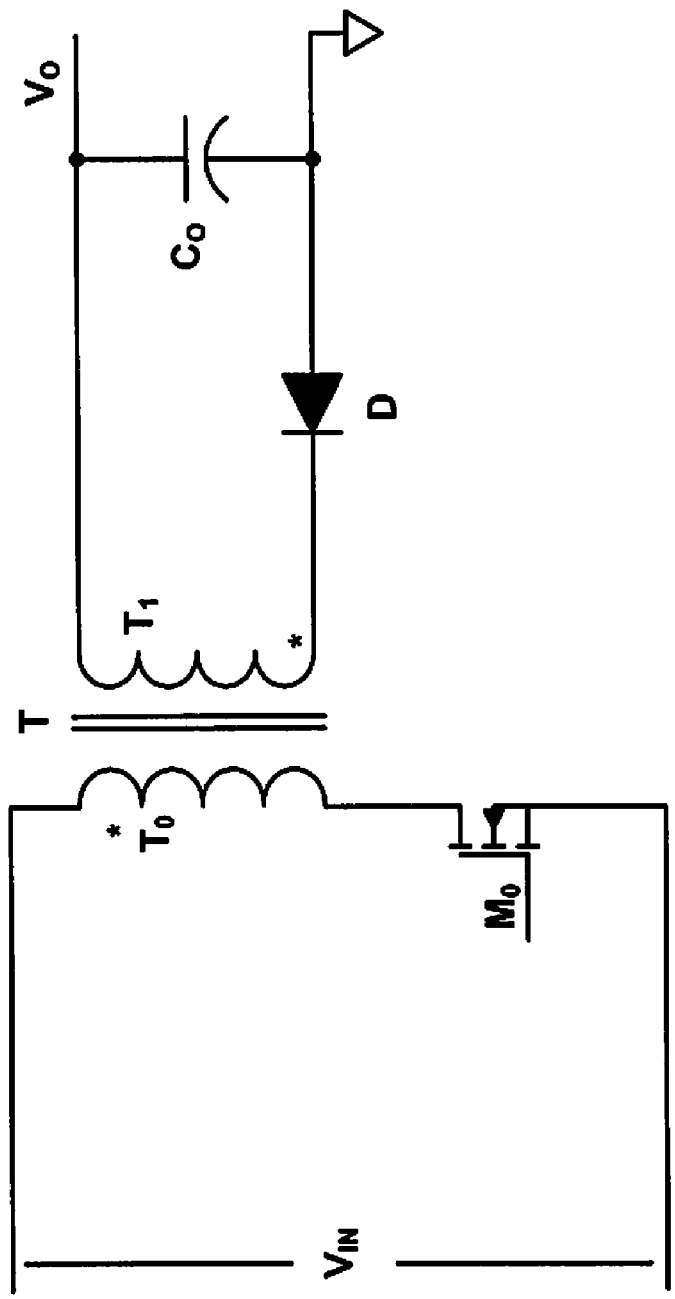
FIG. 1 illustrates a prior art flyback converter.
Figure 2:
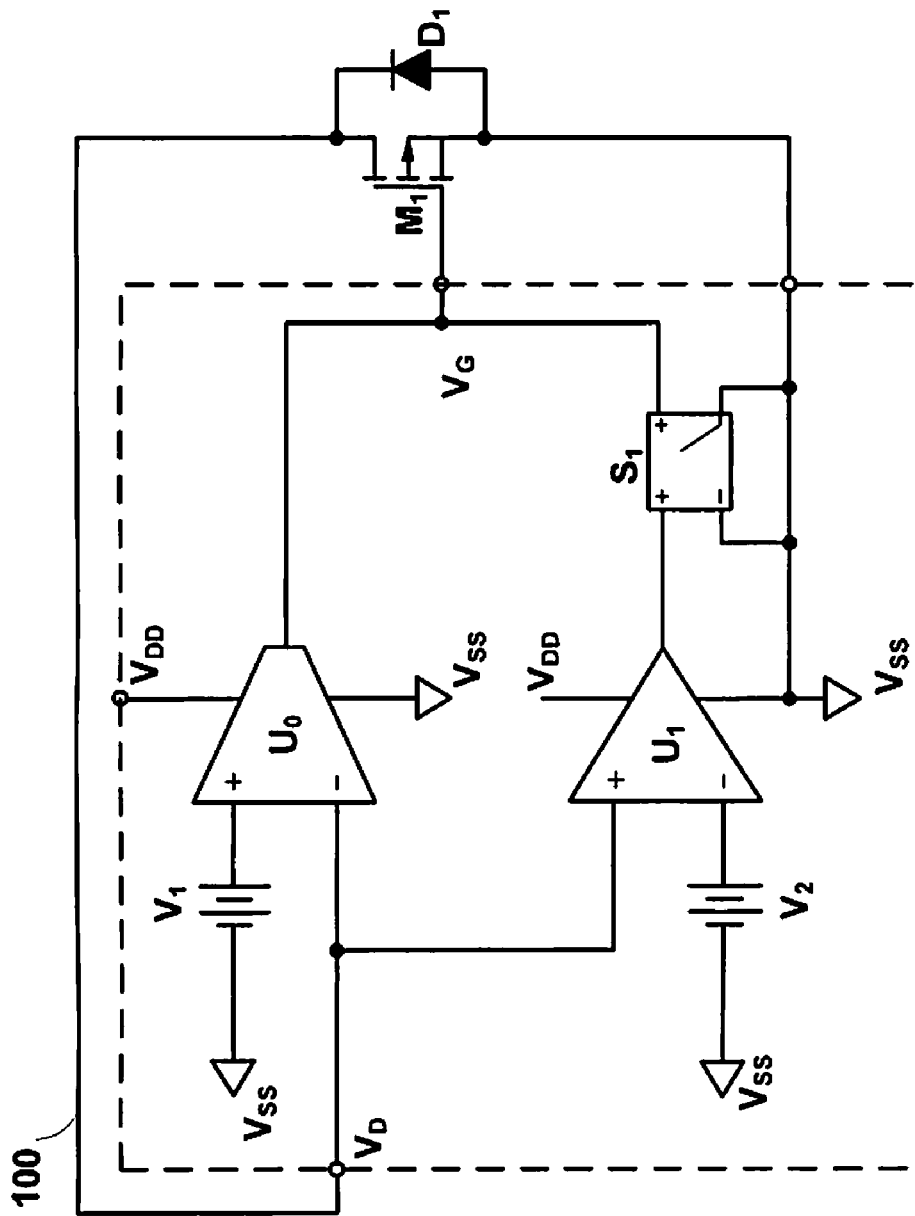
FIG. 2 illustrates a circuit 100 using a transconductance amplifier to turn on a synchronous rectifier FET and uses a comparator to turn off the synchronous rectifier FET in accordance with an embodiment of the present invention.

Now referring to FIG. 2, a circuit 100 using a transconductance amplifier $U_0$ to turn on a synchronous rectifier FET $M_1$, and using a comparator $U_1$ to turn off the synchronous rectifier FET $M_1$ is illustrated. As shown in FIG. 2, circuit 100 comprises the transconductance amplifier $U_0$ receiving a first DC offset $V_1$ at its non-inverting input terminal and receiving a "$V_D$" signal at its inverting input terminal, wherein the $V_D$ signal is the drain signal of the synchronous rectifier FET $M_1$. The drain signal $V_D$ is also sent to the non-inverting input terminal of the comparator $U_1$, while the comparator $U_1$ receives a second DC offset $V_2$ at its inverting input terminal.

The output of the transconductance amplifier $U_0$ is sent to the gate of $M_1$ directly, and the output of the comparator $U_1$ is sent to the gate of $M_1$ via an internal switch $S_1$. When the output of the comparator $U_1$ is high, the internal switch $S_1$ is turned on, pulling the gate of $M_1$ low. When the output of the comparator $U_1$ is low, the internal switch $S_1$ is turned off, releasing the gate of $M_1$ to be controlled by the output of the transconductance amplifier $U_0$. A diode $D_1$ is a parasitic diode that comes with $M_1$ and is used to clamp $V_D$ to a certain negative voltage such as $-0.7V$ during $D_1$'s turn-on.

In operation, if the flyback converter is in continuous current mode, when a main switch on the primary winding $T_0$ in the flyback converter is turned off, the diode $D_1$ is on immediately, which causes $V_D$ to be negative, such as $-0.7V$. As a result, the output of the transconductance amplifier $U_0$, i.e. $V_G$ signal goes high gradually. When $V_G$ increases to the on-threshold of $M_1$, $M_1$ is turned on accordingly. With the turn-on of $M_1$, the diode $D_1$ is off.

When the main switch on the primary winding $T_0$ in the flyback converter is turned on, $V_0$ goes high due to the induced voltage across the secondary winding $T_1$, which causes the output of the transconductance amplifier $U_0$ to be low, i.e., $V_G$ is low. In the meantime, $V_D$ goes higher than the second DC offset $V_2$, and the comparator $U_1$ outputs a high level signal, which turns on the internal switch $S_1$, and pulls low $V_G$. As a result, the synchronous rectifier FET $M_1$ is quickly turned off.

If the flyback converter is in DCM or quasi resonant mode, when the main switch on the primary winding $T_0$ in the flyback converter is turned off, circuit 100's operation is same to that in CCM. However, when the main switch on the primary winding $T_0$ in the flyback converter is turned on, the voltage on $V_D$ goes up slowly. Then the transconductance amplifier $U_0$ will cause $V_G$ to go low and the comparator is not used. Such operation also turns off the synchronous rectifier FET $M_1$.

To avoid the transconductance amplifier $U_0$ and the comparator $U_1$ "fighting" each other, a dead band is introduced, which is the voltage difference between $V_1$ and $V_2$. When $V_D$ drops below $V_1$, the transconductance amplifier $U_0$ tries to keep $V_D$ at the $V_1$ level by regulating $V_G$. When $V_D$ is moving so fast that the transconductance $U_0$ can't hold $V_D$ to $V_1$, $V_D$ will go up and at a certain instant will hit $V_2$. If that happens, the comparator U, turns on an internal switch $S_1$, which swiftly pulls low $V_G$. This will turn off $M_1$ and no current will flow anymore, preventing shoot through.

Many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. A driver circuit for driving a synchronous rectifier FET, comprising:
   a transconductance amplifier having a first input coupled to a first DC offset, a second input coupled to the drain of the synchronous rectifier FET, and an output coupled to the gate of the synchronous rectifier FET; and
   a comparator having a first input coupled to a second DC offset, a second input coupled to the drain of said synchronous rectifier FET, and an output coupled to the gate of the synchronous rectifier FET via a switch, wherein the second input of the transconductance amplifier and the second input of the comparator are coupled to the drain of the synchronous rectifier FET such that the second input of the transconductance amplifier and the second input of the comparator receive a substantially identical signal from the drain of the synchronous rectifier FET, and wherein the output of the transconductance amplifier is not coupled to the gate of the synchronous rectifier FET via the switch.

2. The driver circuit of claim 1, wherein the synchronous rectifier FET is turned on according to an "on" state of a parasitic diode of the synchronous rectifier FET, and when the synchronous rectifier FET is turned on, the parasitic diode is off.

3. The driver circuit of claim 1, wherein the driver circuit is configured such that
   when a drain signal of the synchronous rectifier FET increases at a first rate, the output of the transconductance amplifier turns low to turn off the synchronous rectifier FET; and
   when the drain signal of the synchronous rectifier FET increases at a second rate greater than the first rate, the output of the comparator turns high to turn off the synchronous rectifier FET via the switch.

4. The driver circuit of claim 1, wherein there is a voltage difference between the first DC offset and the second DC offset.

5. The driver circuit of claim 1, wherein
   if the output of the comparator is high, the switch is turned on;
   if the output of the comparator is low, the switch is turned off.

6. A smart driver comprising:
   a transconductance amplifier, operable to amplify the difference between a drain signal of a synchronous rectifier FET and a first DC offset to provide an amplified signal, and to control the synchronous rectifier FET using the amplified signal; and
   a comparator operable to compare the drain signal of the synchronous rectifier FET and a second DC offset to provide a comparison signal, and to control the synchronous rectifier FET by the comparison signal via a switch, wherein the amplified signal provided by the transconductance amplifier is not provided to the synchronous rectifier FET via the switch.

7. The smart driver of claim 6, wherein a parasitic diode is coupled between the source of the synchronous rectifier FET and the drain of the synchronous rectifier FET, such that when the parasitic diode is on, the drain signal of said synchronous rectifier FET is negative.

8. The smart driver of claim 7, wherein
   the synchronous rectifier FET is turned on according to the "on" state of the parasitic diode; and
   when the synchronous rectifier FET is turned on, the parasitic diode is off.

9. The smart driver of claim 6, wherein the driver circuit is configured such that
   when the drain signal of said synchronous rectifier FET increases at a first rate, the amplified signal turns off the synchronous rectifier FET; and
   when the drain signal of the synchronous rectifier FET increases at a second rate greater than the first rate, the comparison signal turns off the synchronous rectifier FET via the switch.

10. The smart driver of claim 6, wherein there is a voltage difference between the first DC offset and the second DC offset.

11. The smart driver of claim 6, wherein
   when the comparison signal is high, the switch is turned on; and
   when the comparison signal is low, the switch is turned off.

12. A method comprising:
   providing a drain signal of a synchronous rectifier FET to a first input of a transconductance amplifier and to a first input of a comparator;
   providing a first DC offset to a second input of the transconductance amplifier;
   providing a second DC offset to a second input of the comparator;
   delivering the output of the transconductance amplifier to the gate of the synchronous rectifier FET; and
   delivering the output of the comparator to the gate of the synchronous rectifier FET via a switch, wherein the output of the transconductance amplifier is not delivered via the switch.

13. The method of claim 12, further comprising
   coupling the source of the synchronous rectifier FET to a low reference level.

14. The method of claim 12, wherein there is a parasitic diode of the synchronous rectifier FET, and the drain signal of the synchronous rectifier FET goes negative when the parasitic diode is on.

15. The method of claim 14, wherein
   the synchronous rectifier FET is turned on according to the "on" state of the parasitic diode; and
   and when the synchronous rectifier FET is turned on, the parasitic diode is off.

16. The method of claim 12, further comprising
   turning off the synchronous rectifier FET by the output of the transconductance amplifier when the drain signal of the synchronous rectifier FET increases at a first rate; and
   turning off the synchronous rectifier FET by the output of the comparator via the switch if the drain signal of the synchronous rectifier FET increases at a second rate greater than the first rate.

17. A smart driver, comprising:
   a first means for controlling a synchronous rectifier FET by amplifying the difference between a drain signal of the synchronous rectifier FET and a first DC offset;

a second means for controlling the synchronous rectifier FET by comparing the drain signal of the synchronous rectifier FET with a second DC offset;

wherein the first means turns on the synchronous rectifier FET when the drain signal is negative, and turns off the synchronous rectifier FET when the drain signal increases at a first rate and the second means turns off the synchronous rectifier FET via a switch when the drain signal increases at a second rate, and wherein the first means does not turn off the synchronous rectifier FET via the switch.

18. The smart driver as set forth in claim 17, wherein there exists a voltage difference between the first DC offset and the second DC offset.

19. The smart driver as set forth in claim 17, wherein a parasitic diode is coupled between the source of the synchronous rectifier FET and the drain of the synchronous rectifier FET, when the parasitic diode is on, the drain signal is negative; when the synchronous rectifier FET is turned on, the parasitic diode is off.

20. A method comprising:
turning on a synchronous rectifier FET when a drain signal of the synchronous rectifier FET is negative; and
turning off the synchronous rectifier FET when the drain signal goes up, wherein
turning off the synchronous rectifier FET comprises
turning off the synchronous rectifier FET by a transconductance amplifier when the drain signal increases at a first rate; and
turning off the synchronous rectifier FET by a comparator via a switch when the drain signal increases at a second rate greater than the first rate, wherein the comparator is connected to the drain of the synchronous rectifier FET, wherein the transconductance amplifier does not turn off the synchronous rectifier FET via the switch.

21. The method as set forth in claim 20, further comprising
comparing the drain signal with a first DC offset by the transconductance amplifier; and
comparing the drain signal with a second DC offset by the comparator;
wherein there exists a voltage difference between the first DC offset and the second DC offset.

22. The method as set forth in claim 20, wherein a parasitic diode is coupled between the source of the synchronous rectifier FET and the drain of the synchronous rectifier FET, such that the drain signal is negative when the parasitic diode is on and when the synchronous rectifier FET is turned on the parasitic diode is off.

* * * * *